United States Patent
Menon et al.

(10) Patent No.: US 9,784,791 B2
(45) Date of Patent: Oct. 10, 2017

(54) APPARATUS AND METHOD TO DEBUG A VOLTAGE REGULATOR

(71) Applicant: Intel Corporation, Santa Clara, CA (US)

(72) Inventors: Sankaran M. Menon, Austin, TX (US); Vasudev Bibikar, Austin, TX (US); P. Reddy Sahajananda, Bangalore (IN); Sunghyun Koh, Austin, TX (US); Naveendran Balasingam, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 334 days.

(21) Appl. No.: 14/335,066

(22) Filed: Jul. 18, 2014

(65) Prior Publication Data

US 2016/0018462 A1 Jan. 21, 2016

(51) Int. Cl.
*G01R 31/317* (2006.01)
*G01R 31/3177* (2006.01)
*G01R 31/02* (2006.01)
*G01R 31/40* (2014.01)
*G05F 1/10* (2006.01)

(52) U.S. Cl.
CPC ..... *G01R 31/31725* (2013.01); *G01R 31/025* (2013.01); *G01R 31/40* (2013.01); *G05F 1/10* (2013.01)

(58) Field of Classification Search
CPC ............ G01R 31/31725; G01R 31/025; G01R 31/40; G05F 1/10
See application file for complete search history.

(56) References Cited

U.S. PATENT DOCUMENTS

| | | | |
|---|---|---|---|
| 6,753,722 B1 * | 6/2004 | Kondapalli | G05F 1/56 327/540 |
| 7,109,783 B1 * | 9/2006 | Kondapalli | G05F 1/56 327/407 |
| 7,319,361 B2 * | 1/2008 | Jin | G05F 1/465 327/530 |
| 7,995,408 B2 * | 8/2011 | Kang | G11C 5/147 365/189.05 |
| 8,446,790 B2 * | 5/2013 | Kang | G11C 5/147 365/189.05 |
| 8,803,558 B2 * | 8/2014 | Im | G11C 29/1201 327/538 |
| 2008/0263377 A1* | 10/2008 | Jorgenson | G06F 1/3203 713/322 |
| 2012/0089856 A1* | 4/2012 | Jorgenson | G06F 1/3203 713/340 |
| 2014/0333137 A1* | 11/2014 | Lin | G01R 31/40 307/66 |

* cited by examiner

*Primary Examiner* — Abdelmoniem Elamin
(74) *Attorney, Agent, or Firm* — Green, Howard & Mughal LLP (57) ABSTRACT

Described is an apparatus which comprises: a first voltage regulator (VR) having a reference input node; and a first multiplexer to provide a reference voltage to the reference input node and operable to select one of at least two different reference voltages as the reference voltage.

19 Claims, 5 Drawing Sheets

APPARATUS AND METHOD TO DEBUG A VOLTAGE REGULATOR

BACKGROUND

A standalone voltage regulator (VR) processor (which is an off-die VR used to provide regulated supply voltage to one or more processors) can be debugged using external pins of the VR processor. However, when a VR is incorporated into a general processor (i.e., on-die VR) or a System-on-Chip (SoC), debugging that VR becomes challenging. For example, having dedicated pins on the SoC for monitoring various characteristics of the VR is expensive. Furthermore, when the general processor or SoC has multiple on-die VRs, then debugging those on-die VRs becomes even more challenging.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

On-die VRs have several benefits over off-die VRs. For example, on-die VRs provide lower level congestion for power rails with lower current requirements than off-die VRs. On-Die VRs also provide shorter response times when powering up or down compared to off-die VRs. Response times for powering up or down off-die VRs are generally based on power management integrated circuits (ICs) which add to the entry-exit latency because of communication between off-die ICs and the off-die VR. One reason for the on-die VRs to exhibit shorter response times, and thus better overall power performance, is that the entry-exit latencies for on-die VRs are reduced compared to the entry-exit latencies of off-die VRs. However, debugging each on-die VR by providing separate pins is cost prohibitive especially when the number of on-die VRs is many (e.g., 30 or even more). Some embodiments describe the apparatus for debugging one or more on-die VRs that provide regulated power supplies to one or more loads.

In some embodiments, shared pins of the processor are used for debugging, testing, or characterizing the one or more on-die VRs. In some embodiments, an analog multiplexer (or tri-state-able multiplexer) is used to monitor the output voltage of any of the one or more on-die VRs. In some embodiments, a digital multiplexer is used to monitor digital signals of any of the one or more on-die VRs. In some embodiments, fuse signals to the one or more on-die VRs is overridden by an apparatus for determining optimized trim settings for the one or more on-die VRs. In some embodiments, the fuses can be programmed according to the determined optimized trim settings. In some embodiments, the finite state machine (FSM) associated with the one or more on-die VRs is debugged with an apparatus by overriding the clock signal to the FSM with a signal having controlled edge transitions. In some embodiments, an apparatus is provided to adjust reference voltage to the on-die VR to determine the requisite output voltage level for that on-die VR.

While the embodiments are described with reference to an on-die VR implemented as a low-dropout (LDO) VR, any type of VR may be used with the embodiments to debug that on-die VR. For example, the apparatus for debugging the on-die VR can be used for debugging an all digital LDO (DLDO) VR, an all analog LDO VR, a mixed-signal LDO VR, a DC-DC converter, a buck converter, a boost converter, etc.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 1:
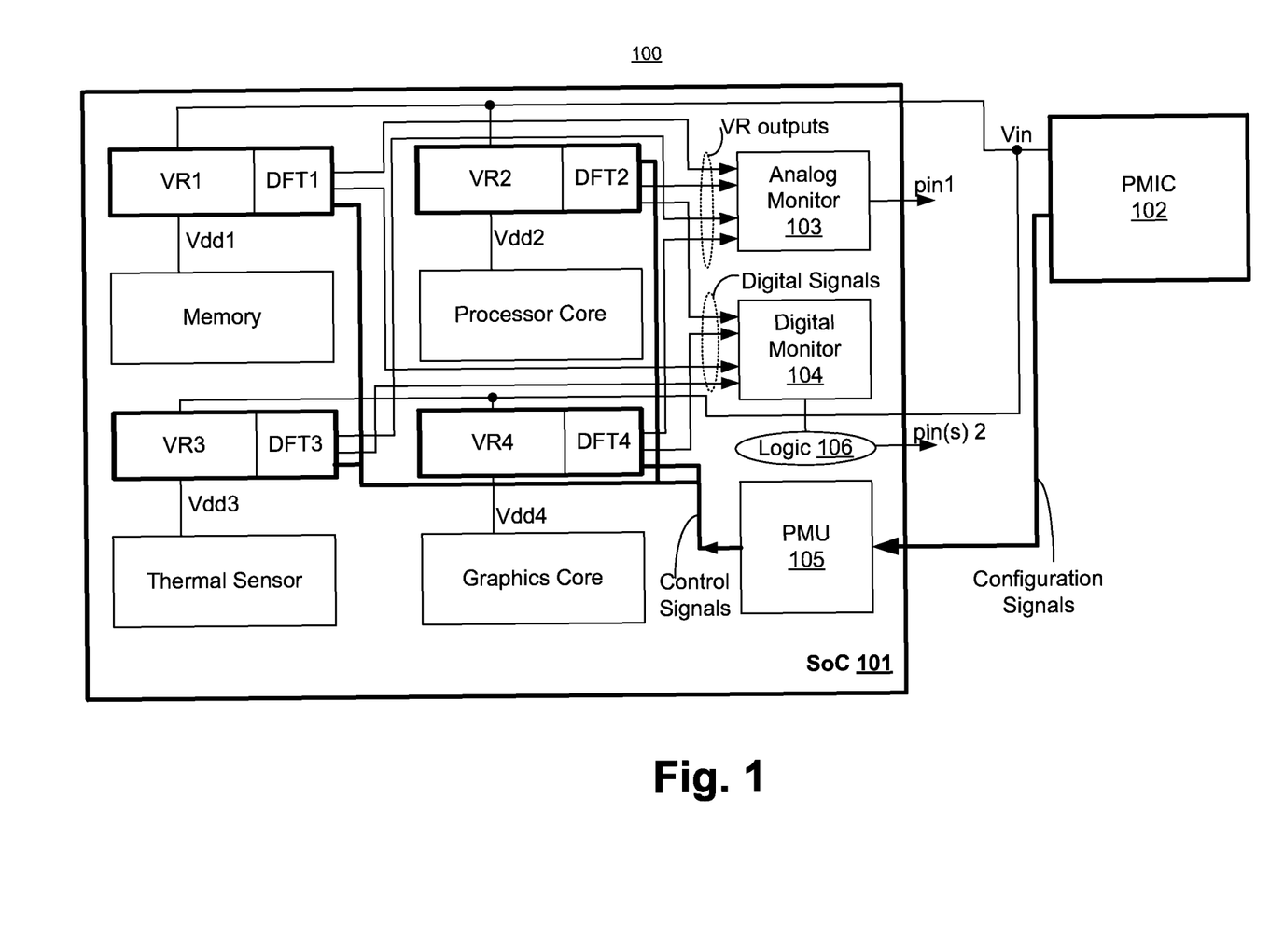
FIG. 1 illustrates a high-level system of a System-on-Chip (SoC) with an apparatus to debug one or more voltage regulators (VRs) in the SoC, according to some embodiments of the disclosure.

FIG. 1 illustrates a high-level system 100 of a SoC with an apparatus to debug one or more VRs in the SoC, according to some embodiments of the disclosure. In some embodiments, system 100 comprises SoC 101 and Power Management Integrated Circuit (PMIC) 102. In some embodiments, SoC 101 comprises Power Management Unit (PMU) 105 and apparatus for debugging one or more VRs (e.g., VR1-VR4) including design-for-test (DFT) circuits associated with each VR (e.g., DFT1-DFT4), Analog Monitor 103, Digital Monitor 104, and Logic 106. In some embodiments, DFT circuits (e.g., DFT1-DFT4) associated with each VR include multiplexers and logic for providing alternate signals to various components of the VR, and control logic for controlling those multiplexers and their inputs. Some embodiments of the DFT circuits and the VR circuits are described with reference to FIGS. 2-4.

Referring back to FIG. 1, in some embodiments, each on-die VR of the one or more VRs provides corresponding regulated power supply to its load. For example, VR1 provides Vdd1 power supply to the Memory of SoC 101, VR 2 provides Vdd2 power supply to the Processor Core of SoC 101, VR3 provides Vdd3 power supply to the Thermal Sensor of SoC 101, and VR4 provides Vdd4 power supply to the Graphics Core, where the power supply level of each Vdd may be different from one another according to the requirements of its respective loads.

Here, Memory, Processor Core, Thermal Sensor, and Graphics Core are illustrated as example loads. However, some embodiments for debugging one or more VRs (e.g., VR1-VR4) are applicable to any type of loading conditions. While the one or more VRs are described with reference to four VRs (i.e., VR1-Vr4), the embodiments for debugging the VRs is applicable to any number of VRs.

In some embodiments, PMIC 102 provides input power supply Vin to the one or more VRs and also Configuration Signals to PMU 105. In some embodiments, PMU 105 provides Control Signals for controlling/setting various attributes of the one or more VRs. Examples of the Control Signals include signals to enable the one or more VRs, signals to change operation mode (e.g., normal mode, bypass mode, debug mode, etc.) of the one or more VRs, frequency of the clock signals to the one or more VRs, etc.

In some embodiments, Analog Monitor 103 receives analog inputs (e.g., VR outputs, reference voltages, etc.) from each VR, and provides the capability to monitor any of those analog inputs as output of Analog Monitor 103. In some embodiments, output of Analog Monitor 103 is viewable on a pin (e.g., pin 1) of SoC 101. In some embodiments, pin 1 may be coupled to another apparatus (e.g., oscilloscope or voltmeter) to determine the signal attributes of the signal on pin 1. In some embodiments, Digital Monitor 104 receives digital signals from each VR and provides the capability to monitor any of those Digital Signals as output of Digital Monitor 104.

In some embodiments, the output of Digital Monitor 104 is multiplexed with other DFT outputs of SoC 101 and made visible to testers. In some embodiments, the output of Digital Monitor 104 is received by Logic 106 (e.g., buffers, multiplexers, etc.) and provided as output to one or more pins (e.g., pin(s) 2). In some embodiments, pin(s) 2 may be coupled to another apparatus (e.g., oscilloscope, voltmeter, logic analyzer, etc.) to determine the signal attributes of the signal(s) on pin(s) 2.

Figure 2:
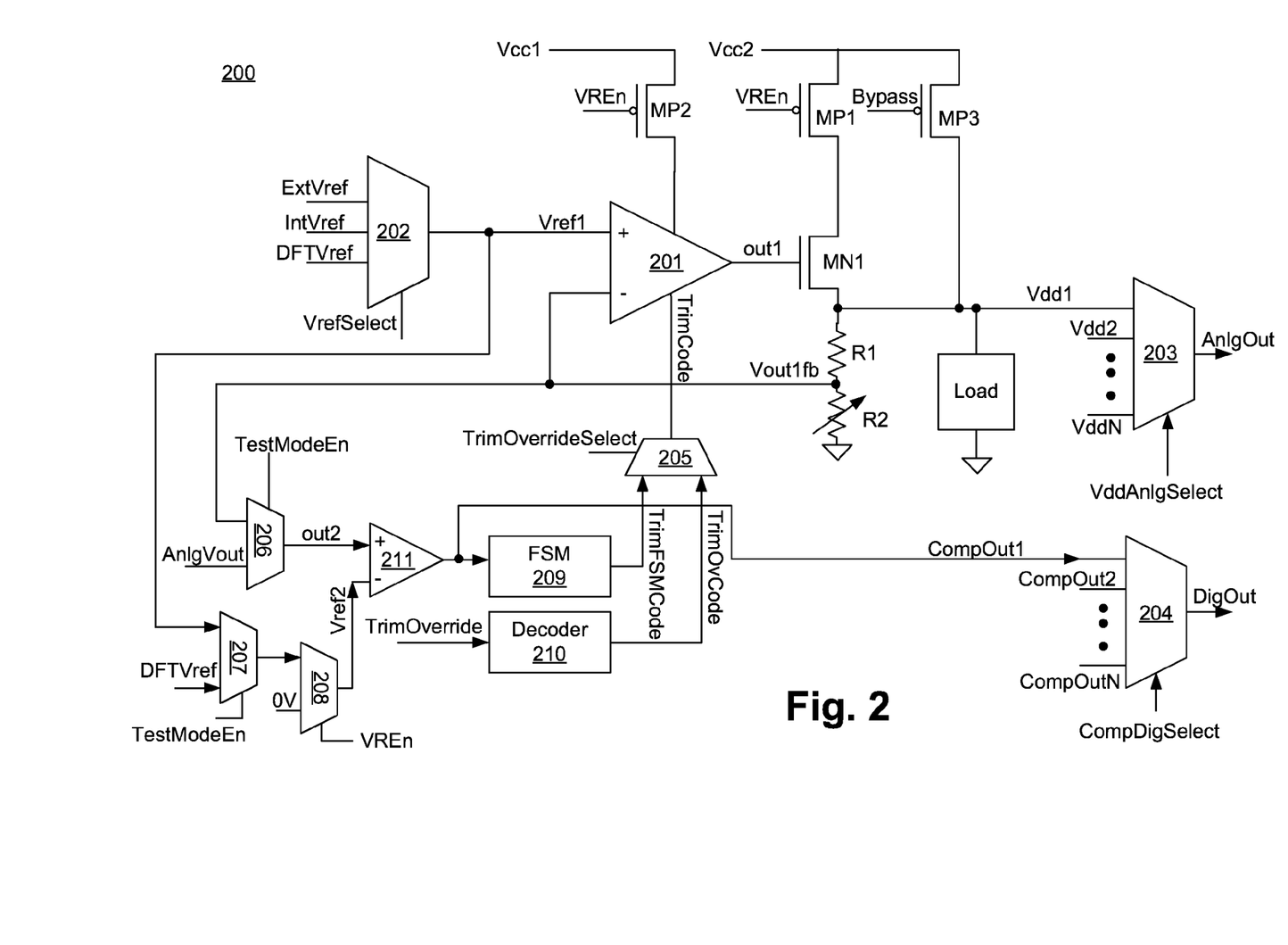
FIG. 2 illustrates an apparatus for debugging one or more VRs, according to some embodiments of the disclosure.

FIG. 2 illustrates a circuit 200 with an apparatus for debugging the one or more VRs, according to some embodiments of the disclosure. It is pointed out that those elements of FIG. 2 having the same reference numbers (or names) as the elements of any other figure can operate or function in any manner similar to that described, but are not limited to such. So as not to obscure the embodiments, in this example, a single VR is shown with associated DFT circuits. Other VRs may have identical DFT circuits or different DFT circuits to provide knobs for debugging the VR and associated logic.

In some embodiments, circuit 200 comprises comparator or amplifier 201, multiplexers 202, 203, 204, 205, 206, 207, and 208; FSM 209, Decoder 210, comparator 211, n-type transistor MN1, p-type transistors MP1, MP2, and MP3; and resistors R1 and R2. Here, amplifier 201 along with transistor MN1 and resistors R1 and R2 form an LDO VR, while FSM 209 and comparator 211 are the associated logic for controlling the trimming conditions of the LDO VR. Here, labels for nodes and signals on those nodes are interchangeably used. For example, CompOut1 refers to the output signal of comparator 211 or to the node CompOut1 depending on the context of the sentence.

In some embodiments, the LDO VR operates in normal mode when VREn (VR enable signal) is logical low (e.g., 0Vs) which causes transistors MP1 and MP2 to turn ON and provide power supplies Vcc1 and Vcc2 to comparator 201 and transistor MN1, respectively. Amplifier 201 of LDO VR compares a version of the output Vdd1 (i.e., Vout1$fb$) with a reference voltage Vref1 and controls the driving strength of transistor MN1 using the output out1 of amplifier 201 until the voltage on Vout1$fb$ is substantially equal to the voltage of Vref1. In some embodiments, resistors R1 and R2 form a voltage divider (that generate Vout1$fb$ signal) to provide tuning ability to Vdd1 voltage level by adjusting resistance of resistor R2. In some embodiments, amplifier 201 of LDO VR receives TrimCode (a digital code) that is used to adjust (i.e., trim) the input offset of amplifier 201 to further adjust the voltage level of Vdd1.

In some embodiments, in normal operation, the TrimCode is generated by FSM 209 which receives the output CompOut1 from comparator 211 to determine how much voltage level of Vdd1 needs to be adjusted. In normal mode, comparator 211 compares the voltage level of Vout1fb (received as out2) with the voltage level of Vref1 (received as Vref2) to generate the output CompOut1 that indicates whether the voltage level of Vout1fb is above or below the voltage level of Vref1, and based on that determination FSM 209 determines the TrimCode.

In some embodiments, the apparatus for debugging the LDO VR includes p-type transistor MP3 which is operable to bypass the LDO VR by providing Vcc2 to Vdd1 as power supply to the Load instead of providing the output from LDO VR (i.e., output from the source terminal of transistor MN1 is coupled to the node Vdd1 and to resistor R1). In some embodiments, the source terminal of transistor MP3 is coupled to Vcc2, the drain terminal of transistor MP3 is coupled to Vdd1, and the gate terminal of transistor MP3 is coupled to Bypass. In some embodiments, the Bypass signal is provided by PMU 105. In some embodiments, the Vcc2 power supply is provided by PMIC 102. In other embodiments, the Vcc2 power supply may be an external power supply provided from another source. In some embodiments, when the LDO VR is bypassed (i.e., when transistor MP3 is turned ON), LDO VR is disabled because transistors MP2 and MP1 are turned OFF. In some embodiments, transistor MP1 provides controllable current path from Vcc2 power supply node to transistor MN1 while transistor MP2 provides controllable current path from Vcc1 power supply node to amplifier 201. By having the ability to bypass the LDO VR, a problem (or malfunctioning) LDO VR can be isolated and the Load can be powered by the Vcc2 power supply instead of the output of the LDO VR.

In some embodiments, the apparatus for debugging the LDO VR includes multiplexer 202 which is controllable by the VrefSelect signal. In some embodiments, multiplexer 202 is operable to provide one of several external references as Vref1 to amplifier 201. For example, ExtVref reference voltage, internally generated IntVref reference voltage, and design-for-test (DFT) DFTVref reference voltage are selectable by multiplexer 202. In some embodiments, IntVref reference voltage is generated on-die in SoC 101 by a reference generator (e.g., bandgap reference generator, voltage divider, etc.). In some embodiments, ExtVref reference voltage is generated outside SoC 101 and is provided to SoC 101 using a pin. In some embodiments, DFTVref reference voltage is generated inside SoC 101 or externally outside SoC 101 and can be adjusted to various voltage levels for debugging or characterizing the LDO VR.

In some embodiments, the apparatus for debugging the LDO VR includes multiplexer 203 (same as Analog Monitor 103) which is controllable by the VddAnlgSelect signal (i.e., analog select signal). In some embodiments, multiplexer 203 is a tri-state-able multiplexer that allows one of the inputs Vdd1-VddN (where, 'N' is an integer) to be selected for output on node AnlgOut and the others to be tri-stated, where Vdd2 is output of another LDO VR, and so on. In some embodiments, multiplexer 203 allows for analog signal monitoring of any of the LDO VRs in SoC 101.

In some embodiments, multiplexer 203 is implemented with pass-gates to allow one of the analog signals Vdd1-VddN to pass through as output. In some embodiments, multiplexer 203 provides visibility to the analog signals on node AnlgOut which may be coupled to pin 1 for external observation. Here, multiplexer provides the ability to monitor analog signals. For example, when the voltage level of Vref1 is adjusted, the voltage level of Vdd1 changes, and this change can be monitored using multiplexer 203 by selecting Vdd1 for observation on node AnlgOut.

In some embodiments, instead of multiplexer 203, analog signals (e.g., Vdd1-VddN) are monitored by wire-ORing the analog nodes to the AnlgOut port (or node). In some embodiments, the analog signal which is monitored is identified while the other analog signals are tri-stated by disabling those respective LDO VRs. For example, when Vdd1 of VR1 is to be monitored on the AnlgOut port then VREn signals to other LDO VRs (e.g., VR2, VR3, and onwards) are set to disable those LDO VRs while VR1 remains enabled.

While the embodiment of FIG. 2 shows multiplexer 203 (or the wire-ORing technique) used to monitor the output (e.g., Vdd1, Vdd2, etc.) of LDO VRs, other analog signals (e.g., Voutfb, Vref1, etc,) can be monitored in a similar way. In some embodiments, other analog multiplexers are used in addition to multiplexer 203. In some embodiments, multiplexer 203 is a shared multiplexer which is used in conjunction with other analog multiplexers to pass through other analog signals to node AnlgOut.

In some embodiments, the apparatus for debugging the LDO VR includes multiplexer 204 (same as digital monitor 104) which is controllable by the CompDigSelect signal. Compared to multiplexer 203, multiplexer 204 is a digital multiplexer, according to some embodiments. In some embodiments, multiplexer 204 allows one of the inputs CompOut1 to CompOutN (where, 'N' is an integer) to be selected for output on node DigOut, where CompOut2 is the output of another LDO VR, and so on. In some embodiments, multiplexer 204 allows for digital signal monitoring of any of the LDO VRs in SoC 101. In some embodiments, multiplexer 204 is implemented with pass-gates to allow one of the digital signals CompOut1-CompOutN to pass through as output.

In some embodiments, multiplexer 204 provides visibility to digital signals on the node DigOut which may be coupled to pin(s) 2 for external observation. Here, multiplexer 204 provides the ability to monitor digital signals. For example, when the voltage level of Vref1 is adjusted, the trip point for comparator 211 changes. This change in the trip point can be monitored with multiplexer 204 by selecting CompOut1 for observation on the node DigOut. While the embodiment of FIG. 2 shows multiplexer 204 used to monitor output of comparator 211 (e.g., CompOut1, CompOut2, etc.) of the LDO VRs, other digital signals (e.g., internal signals of FSM, etc,) can be monitored in a similar way.

In some embodiments, the apparatus for debugging the LDO VR includes multiplexer 205 which is controllable by the TrimOverrideSelect (i.e., trim override select bit) signal. With this DFT feature, the TrimCode (trim code) bits from FSM 209 can be overridden by the TrimOverride bits (i.e., bits to override the trim code). The TrimCode bits are used to adjust or cancel the input offset of amplifier 201. The TrimCode bits can also be used to change other attributes of the LDO VR.

In some embodiments, multiplexer 205 receives the TrimOvCode bits (trim override code bits) and the output TrimFSMCode bits (i.e., time code bits) from FSM 209. In some embodiments, the TrimOverride bits are directly provided to multiplexer 205. In some embodiments, the TrimOverride bits are fewer bits than the TrimOvCode bits. In some embodiments, Decoder 210 is used to decode the TrimOverride code bits to generate the TrimOvCode bits. For example, the TrimOverride code bits may be a 3 bit binary code which Decoder 210 converts to the TrimOvCode bits which may be a thermometer code. One way to override the TrimFSMCode bits is described with reference to FIG. 3.

Figure 3:
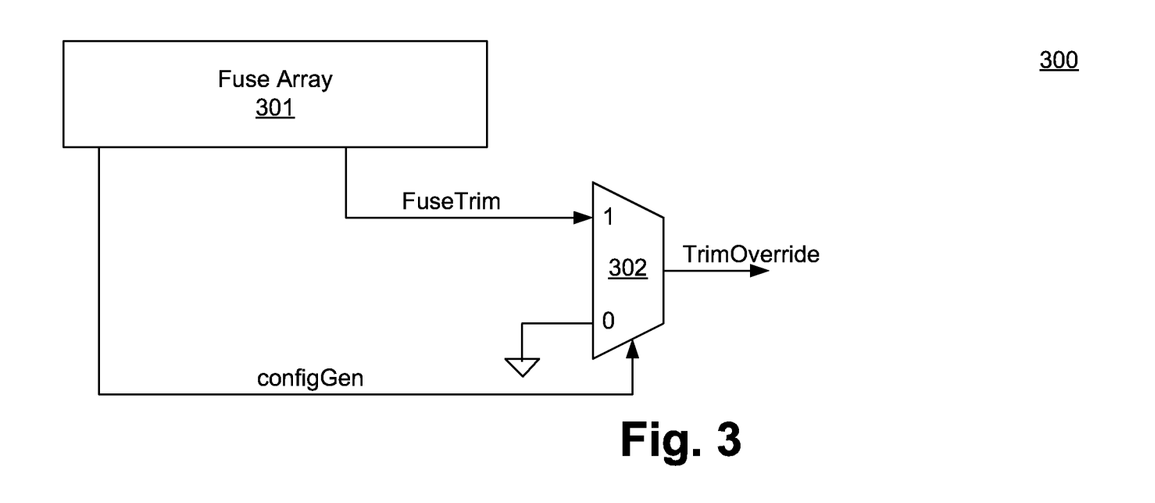
FIG. 3 illustrates an apparatus for fuse overriding to debug a VR, according to some embodiments of the disclosure.

FIG. 3 illustrates an apparatus 300 for fuse overriding to debug a VR, according to some embodiments of the disclosure. It is pointed out that those elements of FIG. 3 having the same reference numbers (or names) as the elements of any other figure can operate or function in any manner similar to that described, but are not limited to such.

In some embodiments, apparatus 300 comprises Fuse Array 301 and a plurality of multiplexers 302. In some embodiments, instead of using the FuseTrim codes (i.e., trimming code bits) from Fuse Array 301 as the TrimOverride code for initializing the TrimCode bit values for amplifier 201, the initial TrimOverride codes are generated independent of the FuseTrim code values. In some embodiments, multiplexer 302 selects predetermined values for the TrimOverride bits by selecting inputs other than the FuseTrim bits (or code). In this example, the configGen signal is used by multiplexer 302 to bypass the FuseTrim code, and to use the predetermined codes which are logical '0 or '1. These predetermined codes may be generated by simulations prior to fabrication of SoC 101.

In some embodiments, the TrimOverrideSelect bit is set to use TrimOverride codes (i.e., TrimOvCode bits) so that the predetermined codes are used for the initial assessment of the LDO VR behavior. In some embodiments, once the desired attributes for the LDO VR are achieved using the TrimOverride codes, Fuse Array 301 is programmed to generate the FuseTrim code according to the predetermined codes and the process-voltage-temperature (PVT) characterization of the LDO VR. In some embodiments, Fuse Array 301 is set for each LDO VR according to its desired output. Once the FuseTrim code is set and provided as the TrimCode bits for amplifier 201, FSM 209 can begin its normal function to generate real-time TrimFSMCode bits according to PVT variations of SoC 101 and provide them as TrimCode bits for amplifier 201.

Referring back to FIG. 2, in some embodiments, inputs to comparator 211 can be overridden to characterize comparator 211. In some embodiments, the apparatus for debugging the LDO VR includes multiplexer 206 which is controllable by TestModeEn bit (i.e., test mode enable) signal. In some embodiments, to debug comparator 211 and to determine its trip point, TestModeEn bit signal is set to override the Vout1fb signal and provide an analog voltage AnlgVout to the positive terminal of comparator 211 (i.e., the node out2 is coupled to the node AnlgVout). In some embodiments, the AnlgVout voltage level may be generated by any known reference generator (e.g., voltage divider, bandgap reference generator, etc.) and can be adjusted to different voltage levels to characterize comparator 211. In some embodiments, the output CompOut1 of comparator 211 can be monitored using multiplexer 204 to determine the trip point of comparator 211.

In some embodiments, the apparatus for debugging the LDO VR includes multiplexer 208 which is controllable by the VREn (i.e., VR enable) signal. In some embodiments, when the LDO VR is disabled or bypassed, the node Vref2 is forced to zero by the VREn signal. Node Vref2 is coupled to the negative terminal of comparator 211 and is forced to zero by the VREn signal that selects Vss (i.e., 0V) to couple to the node Vref2. In normal operation (i.e., when the LDO VR is enabled), the node Vref2 is coupled to the node Vref1 via multiplexers 207 and 208.

In some embodiments, the apparatus for debugging the LDO VR includes multiplexer 207 which is controllable by the TestModeEn signal. In some embodiments, when the test mode is enabled, the TestModeEn bit causes multiplexer 207 to select the DFTVref reference voltage as the Vref2 reference voltage (instead of Vref1 reference voltage) for comparator 211. By varying the voltage levels of DFTVref and AnlgVout voltage references, the trip point of comparator 211 can be characterized.

In some embodiments, the apparatus for debugging the LDO VR includes logic to control the clock signal of FSM 209. In some embodiments, to debug FSM 209, its clock signal is overridden by known transition edges that control when FSM 209 transitions from one state to another state. One such apparatus is described with reference to FIG. 4.

Figure 4:
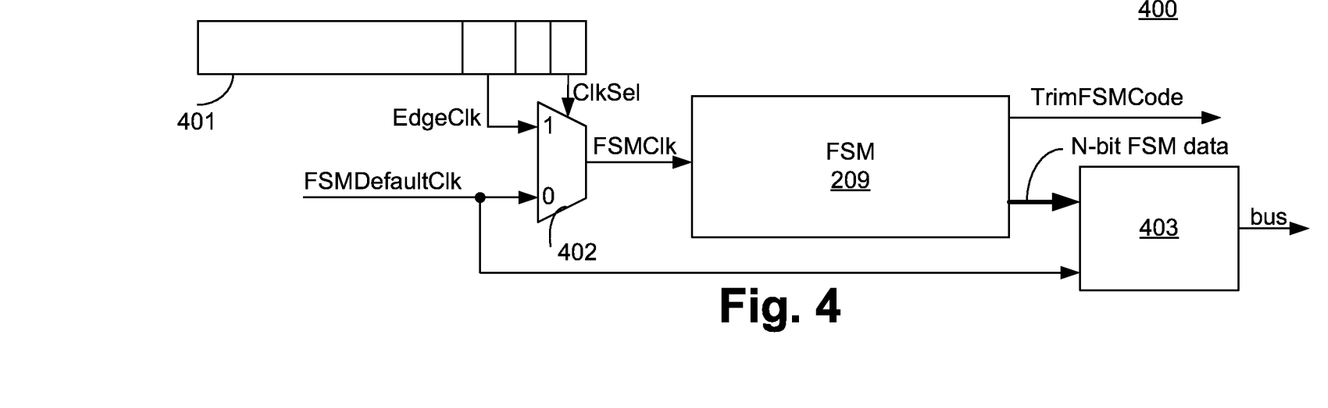
FIG. 4 illustrates an apparatus for controlling flow of a finite state machine (FSM) for debugging a VR, according to some embodiments of the disclosure.

FIG. 4 illustrates an apparatus 400 for controlling the state flow of FSM 209 for debugging a VR, according to some embodiments of the disclosure. It is pointed out that those elements of FIG. 4 having the same reference numbers (or names) as the elements of any other figure can operate or function in any manner similar to that described, but are not limited to such.

In some embodiments, apparatus 400 comprises a plurality of registers 401 and multiplexer 402. In some embodiments, the FSMClk (FSM clock) output of multiplexer 402 is used to provide a clock signal or transition edge to FSM 209. In some embodiments, to debug FSM 209, ClkSel (clock select) bit signal selects one of the EdgeClk (transition edge) signals from one of the registers of the plurality of registers 401 as output FSMClk. In some embodiments, by controlling when the EdgeClk transition edge appears, FSM 209 operation is controlled. In some embodiments, each register in the plurality of registers 401 includes an EdgeClk bit with a different transition time. For example, FSM 209 transitions from one state to another state in response to a transition edge of the FSMClk, and that transition from one state to another state is controlled by selecting one of the EdgeClk signals from the plurality of registers 401. In normal operation, the ClkSel signal is set to select the FSMDefaultClk signal (e.g., 19 MHz signal) as FSMClk via multiplexer 402.

In some embodiments, N-bits of FSM data (e.g., 8-bits of internal FSM signals) along with the FSMDefualtClk clock signal (e.g., 19.2 MHz of FSM clock or of any other clock frequency) are provided to processor debug apparatus 403, where 'N' is an integer. In some embodiments, processor debug apparatus 403 then provides a bus output for external monitoring of the N-bits of FSM data with reference to its associated clock, FSMDefualtClk.

Referring back to FIG. 2, in some embodiments, the apparatus for debugging the LDO VR includes logic to interface various internal nodes (e.g., internal nodes of FSM 209) carrying digital signals to the general DFT circuits of SoC 101. In some embodiments, a tester hooked to SoC 101 can also monitor the internal nodes of the LDO VR along with the SoC level signals. In some embodiments, the apparatus for debugging the LDO VR also includes logic to stall hardware and/or firmware logic flows while allowing debug of the one or more LDO VRs. For example, the apparatus for debugging the LDO VR can pause an operation of a FSM of PMU 105 to stall a boot flow while allowing any of the LDO VRs to be debugged irrespective of proper boot up of SoC 101.

Figure 5:
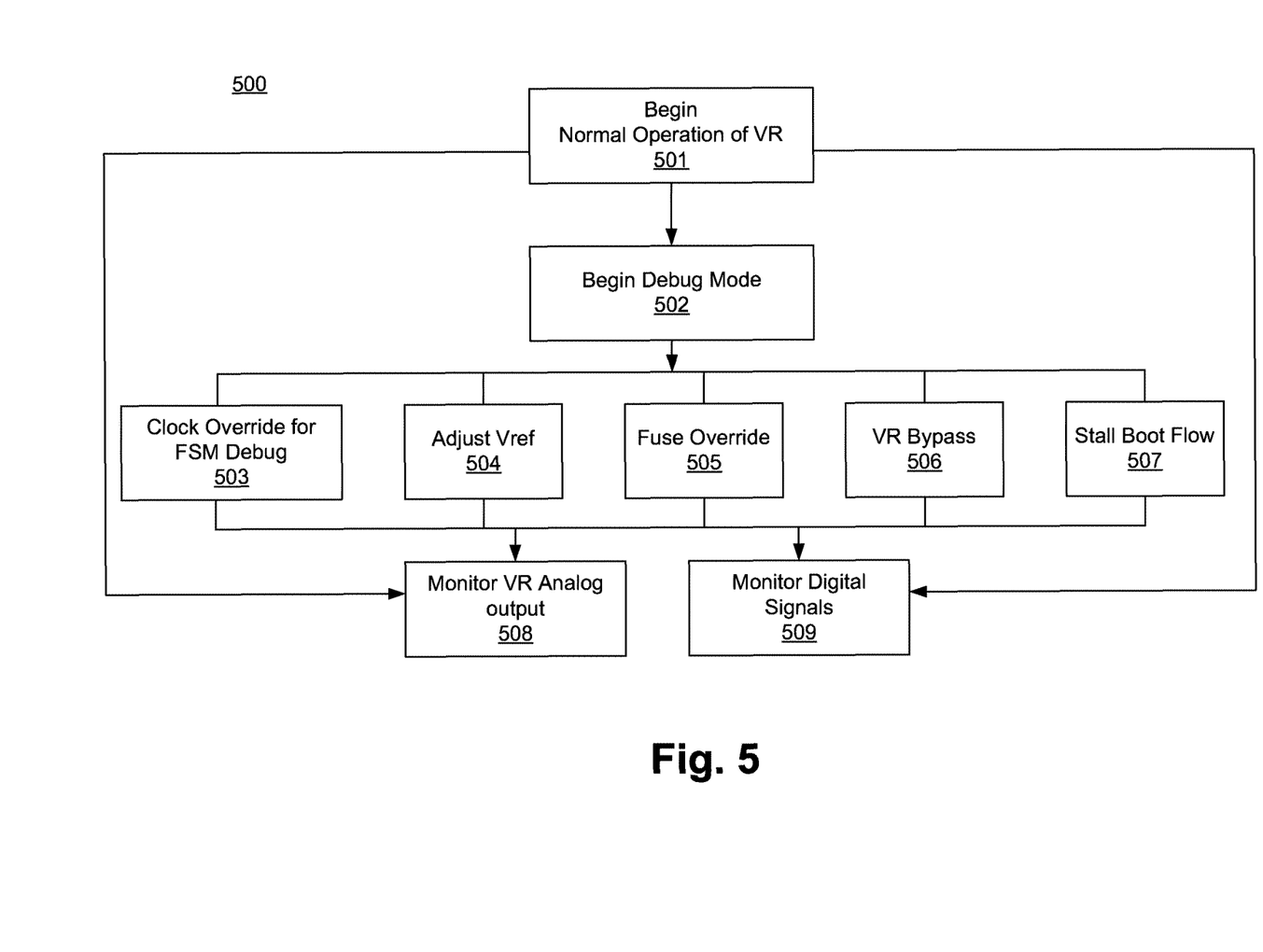
FIG. 5 illustrates a flowchart of various methods for debugging one or more VRs, according to some embodiments of the disclosure.

FIG. 5 illustrates a flowchart 500 of various methods to debug one or more VRs, according to some embodiments of the disclosure. It is pointed out that those elements of FIG. 5 having the same reference numbers (or names) as the elements of any other figure can operate or function in any manner similar to that described, but are not limited to such.

Although the blocks in the flowchart 500 with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 501, SoC 101 operates in normal mode and the LDO VRs operate in normal mode providing their respective output voltages (e.g., Vdd1-VddN) to their respective loads. In some embodiments, these output voltages can be monitored during normal mode operation or during debug mode operation using multiplexer 203 as illustrated by block 508. In some embodiments, digital signals (e.g., CompOut1, CompOut2, etc.) of the LDO VRs can be monitored during normal mode operation or during debug mode operation using multiplexer 204 as illustrated by block 509.

At block 502, SoC 101 enters into debug mode which allows usage of various knobs of the apparatus for debugging the LDO VRs. Some of these knobs are illustrated by blocks 503, 504, 505, 506, and 507. For example, at block 502, FSM 209 can be debugged by overriding the FSMDefaultClk clock as described with reference to FIG. 4. Referring back to FIG. 5, at block 504, Vref1 and/or Vref2 voltage levels can be adjusted for modifying threshold voltage of amplifier 201 and/or comparator 211. At block 505, Fuse Array 401 is bypassed and predetermined values for TrimOverride bits are used as TrimCode bits for amplifier 201. At block 506, the LDO VR can be bypassed and Vcc2 power supply can be provided to the Load. At block 507, the apparatus for debugging the LDO VR can pause an operation of a FSM of PMU 105 to stall a boot flow while allowing any of the LDO VRs to be debugged irrespective of proper boot up of SoC 101. Other aspects of the debugging apparatus described with reference to FIGS. 1-4 can also be included in flowchart 500.

Figure 6:
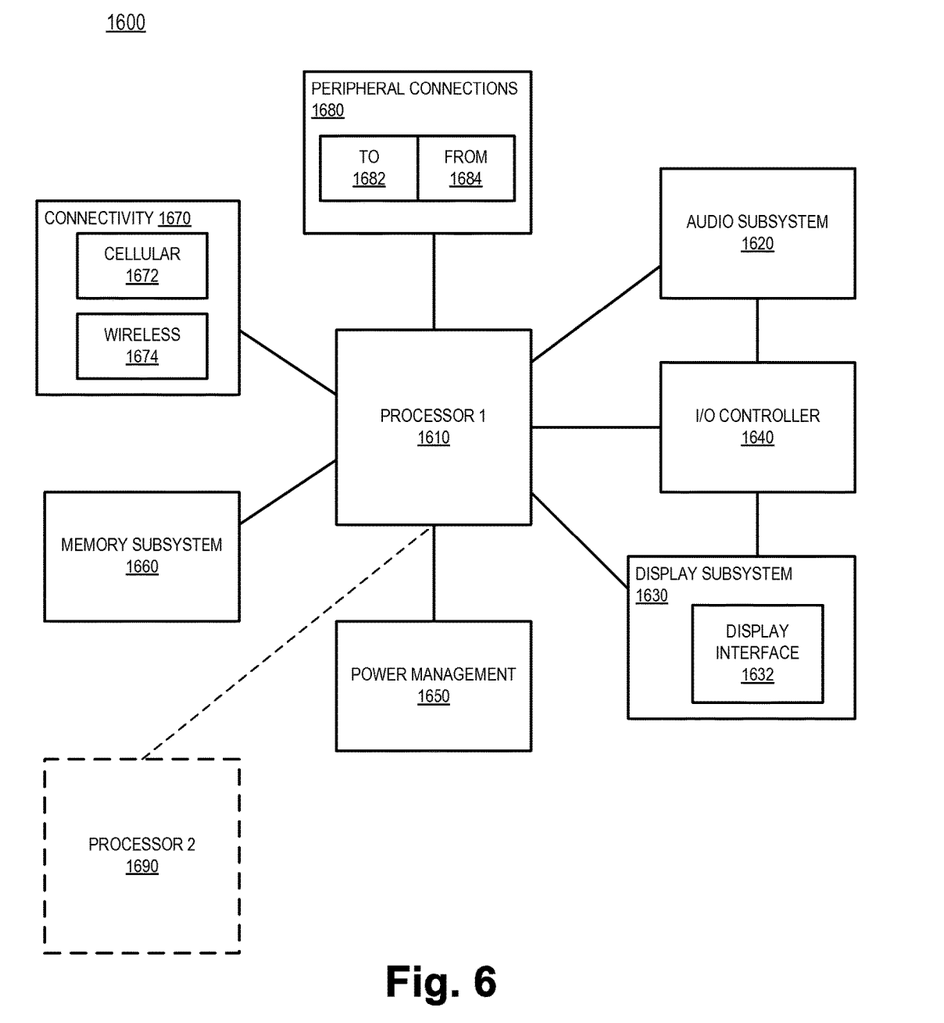
FIG. 6 illustrates a smart device or a computer system or a SoC with apparatus for debugging one or more VRs, according to some embodiments of the disclosure.

FIG. 6 illustrates a smart device or a computer system or a SoC with apparatus for debugging one or more VRs, according to some embodiments of the disclosure. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with apparatus for debugging one or more VRs, according to the embodiments discussed. Other blocks of the computing device 1600 may also include the apparatus for debugging one or more VRs of the embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In some embodiments, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In some embodiments, display interface 1632 includes logic separate from processor 1610 to perform at least some processing related to the display. In some embodiments, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first VR having a reference input node; and a first multiplexer to provide a reference voltage to the reference input node and operable to select one of at least two different reference voltages as the reference voltage. In some embodiments, the first VR includes an output node to provide an output, and wherein the apparatus comprises: a second VR having an output node to provide an output; and a second multiplexer coupled to the output nodes of the first and second VRs, the second multiplexer operable to select one of outputs on the output nodes of the first and second VRs.

In some embodiments, the apparatus comprises a pin for viewing output of the second multiplexer. In some embodiments, the second multiplexer is an analog multiplexer comprising pass-gates. In some embodiments, the second multiplexer is a tri-state-able multiplexer which is operable to tri-state all but one input to the second multiplexer. In some embodiments, outputs of the first and second VRs are wired-OR together on a common node.

In some embodiments, the apparatus comprises an input for overriding an output from a fuse, wherein the input is received by a third multiplexer which is operable to set a configuration of the first VR. In some embodiments, the apparatus comprises a FSM to provide a configuration for the first VR. In some embodiments, the apparatus comprises a fourth multiplexer which is operable to select one of a clock signal or an output of a register for a clock input of the FSM. In some embodiments, the output of the register is a transition edge. In some embodiments, the apparatus comprises logic to monitor nodes internal to the FSM.

In some embodiments, the apparatus comprises a p-type transistor coupled to an output node of the first VR and a power supply, wherein the p-type transistor is operable to couple the power supply to an output node of the first VR when the first VR is disabled. In some embodiments, the apparatus comprises logic which is operable to stall a FSM of a PMU, the PMU for controlling the first VR. In some embodiments, the apparatus comprises a first comparator and associated logic which is operable to couple the output node of the first VR with an input node of the first comparator, the first comparator having an output node coupled to a fourth multiplexer.

In some embodiments, the apparatus comprises a second comparator and associated logic which is operable to couple the output node of the second VR with an input node of the second comparator, wherein the fourth multiplexer is operable to couple one of the output nodes of the first or second comparators to an output node of the fourth multiplexer.

In another example, a system is provided which comprises: a PMIC; a memory; a SoC to receive input power supply from the PMIC, wherein the SoC is coupled to the memory and comprises: a first VR having a reference input node; and a first multiplexer to provide a reference voltage to the reference input node and operable to select one of at least two different reference voltages as the reference voltage; and a wireless interface for allowing the SoC to communicate with another device. In some embodiments, the system further comprises a display interface for displaying content processed by the SoC. In some embodiments, the SoC comprises an apparatus according to the apparatus described above.

In another example, an apparatus comprises: a first VR having an output node; a second VR having an output node; and a first multiplexer coupled to the output nodes of the first and second VRs, wherein the first multiplexer is operable to couple one of the output nodes of the first and second VRs to an output node of the first multiplexer. In some embodiments, the apparatus further comprises a first comparator and associated logic which is operable to couple the output node of the first VR with an input node of the first comparator, the first comparator having an output node coupled to a second multiplexer.

In some embodiments, the apparatus further comprises: a second comparator and associated logic which is operable to couple the output node of the second VR with an input node of the second comparator; and a fourth multiplexer which is operable to couple one of the output nodes of the first or second comparators to an output node of the fourth multiplexer.

In another example, a system is provided which comprises a PMIC; a memory; a SoC to receive input power supply from the PMIC, the SoC coupled to the memory, wherein the SoC comprises an apparatus according to the apparatus described above. In some embodiments, the system further comprises a wireless interface for allowing the SoC to communicate with another device. In some embodiments, the system further comprises a display interface for displaying content processed by the SoC.

In some embodiments, a method is provided which comprises: providing a reference voltage to a reference input node of a first VR; entering debug mode for debugging the first VR; and selecting, in response to entering debug mode, one of at least two different reference voltages as the reference voltage. In some embodiments, the method comprises: providing an output on an output node of the first VR; providing an output on an output node of a second VR; and selecting one of the outputs on the output nodes of the first and second VRs.

In some embodiments, the wherein selecting the one of the outputs comprises tri-stating all but one input to a multiplexer. In some embodiments, the method further comprises wire-ORing the outputs of the first and second VRs on a common node. In some embodiments, the method further comprises overriding an output from a fuse to set configuration of the first VR. In some embodiments, the method further comprises providing a configuration for the first VR by a FSM.

In some embodiments, the method comprises selecting one of a clock signal or an output of a register for a clock input of the FSM. In some embodiments, the output of the register is a transition edge. In some embodiments, the method comprises monitoring nodes internal to the FSM. In some embodiments, the method comprises coupling a power supply to an output node of the first VR when the first VR is disabled. In some embodiments, the method comprises stalling a finite state machine of a PMU, the PMU for controlling the first VR. In some embodiments, the method comprises: selecting as output one of digital signals associated with the first and second VRs. In some embodiments, the method comprises: selecting as output one of analog signals associated with the first and second VRs.

In another example, an apparatus is provided which comprises: means for providing a reference voltage to a reference input node of a first VR; means for entering debug mode for debugging the first VR; and means for selecting, in response to entering debug mode, one of at least two different reference voltages as the reference voltage.

In some embodiments, the apparatus comprises: means for providing an output on an output node of the first VR; means for providing an output on an output node of a second VR; and means for selecting one of the outputs on the output nodes of the first and second VRs. In some embodiments, the means for selecting the one of the outputs comprises means for tri-stating all but one input to a multiplexer. In some embodiments, the apparatus further comprises means for wire-ORing the outputs of the first and second VRs on a common node. In some embodiments, the apparatus further comprises means for overriding an output from a fuse to set configuration of the first VR. In some embodiments, the apparatus further comprises means for providing a configuration for the first VR by a FSM. In some embodiment, the apparatus comprises means for selecting one of a clock signal or an output of a register for a clock input of the FSM.

In some embodiments, the output of the register is a transition edge. In some embodiments, the apparatus comprises means for monitoring nodes internal to the FSM. In some embodiments, the apparatus comprises means for coupling a power supply to an output node of the first VR when the first VR is disabled. In some embodiments, the apparatus comprises means for stalling a finite state machine of a PMU, wherein the PMU is used for controlling the first VR. In some embodiments, the apparatus comprises means for selecting as output one of digital signals associated with the first and second VRs. In some embodiments, the apparatus comprises means for selecting as output one of analog signals associated with the first and second VRs.

In another example, a system is provided which comprises: a PMIC; a memory; a SoC to receive input power supply from the PMIC, the SoC coupled to the memory and comprises an apparatus according to the apparatus described above; and a wireless interface for allowing the SoC to communicate with another device. In some embodiments, the system further comprises a display interface for displaying content processed by the SoC.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first voltage regulator (VR) having a reference input node, wherein the first VR includes an output node to provide an output;
a first multiplexer to provide a reference voltage to the reference input node and operable to select one of at least two different reference voltages as the reference voltage;
a finite state machine (FSM) communicatively coupled to the first VR; and
a second VR having an output node to provide an output, wherein the outputs of the first and second VRs are wired-OR together on a common node.

2. The apparatus of claim 1, wherein the apparatus comprises:
a second multiplexer coupled to the output nodes of the first and second VRs, the second multiplexer operable to select one of outputs on the output nodes of the first and second VRs.

3. The apparatus of claim 2 comprises a pin for viewing output of the second multiplexer.

4. The apparatus of claim 2, wherein the second multiplexer is an analog multiplexer comprising pass-gates.

5. The apparatus of claim 2, wherein the second multiplexer is a tri-state-able multiplexer which is operable to tri-state all but one input to the second multiplexer.

6. The apparatus of claim 1 comprises an input for overriding an output from a fuse, wherein the input is received by a third multiplexer which is operable to set a configuration of the first VR.

7. The apparatus of claim 1 wherein the FSM is to provide a configuration for the first VR.

8. The apparatus of claim 7 comprises a fourth multiplexer which is operable to select one of a clock signal or an output of a register for a clock input of the FSM.

9. The apparatus of claim 8, wherein the output of the register is a transition edge.

10. The apparatus of claim 7 comprises logic to monitor nodes internal to the FSM.

11. The apparatus of claim 1 comprises a p-type transistor coupled to an output node of the first VR and a power supply, wherein the p-type transistor is operable to couple the power supply to the output node when the first VR is disabled.

12. The apparatus of claim 1 comprises logic which is operable to stall a finite state machine of a power management unit (PMU), the PMU for controlling the first VR.

13. The apparatus of claim 8 comprises a first comparator and associated logic which is operable to couple the output node of the first VR with an input node of the first comparator, wherein the first comparator has an output node coupled to a fourth multiplexer.

14. The apparatus of claim 13 comprises a second comparator and associated logic which is operable to couple the output node of the second VR with an input node of the second comparator, wherein the fourth multiplexer is operable to couple one of the output nodes of the first or second comparators to an output node of the fourth multiplexer.

15. An apparatus comprising:
a first voltage regulator (VR) having an output node;
a second VR having an output node;
a first multiplexer coupled to the output nodes of the first and second VRs, wherein the first multiplexer is operable to couple one of the output nodes of the first and second VRs to an output node of the first multiplexer; and
a first comparator and associated logic which is operable to couple the output node of the first VR with an input node of the first comparator.

16. The apparatus of claim 15 wherein the first comparator has an output node coupled to a second multiplexer.

17. The apparatus of claim 16 further comprises:
a second comparator and associated logic which is operable to couple the output node of the second VR with an input node of the second comparator; and
a fourth multiplexer which is operable to couple one of the output nodes of the first or second comparators to an output node of the fourth multiplexer.

18. A system comprising:
a Power management integrated circuit (PMIC);
a memory;
a system-on-chip (SoC) to receive input power supply from the PMIC, the SoC coupled to the memory and comprises:
a first voltage regulator (VR) having a reference input node, wherein the first VR includes an output node to provide an output;
a first multiplexer to provide a reference voltage to the reference input node and operable to select one of at least two different reference voltages as the reference voltage; and
a finite state machine (FSM) communicatively coupled to the first VR;
a second VR having an output node to provide an output, wherein the outputs of the first and second VRs are wired-OR together on a common node; and
a wireless interface to allow the SoC to communicate with another device.

19. The system of claim 18, and wherein the SoC comprises:
a second multiplexer coupled to the output nodes of the first and second VRs, wherein the second multiplexer is operable to select one of the outputs of the output nodes of the first and second VRs.

* * * * *